United States Patent
Fujii et al.

(10) Patent No.: US 7,019,956 B2
(45) Date of Patent: Mar. 28, 2006

(54) ELECTROSTATIC CHUCK HAVING BONDED STRUCTURE AND METHOD OF MANUFACTURING THE SAME

(75) Inventors: Tomoyuki Fujii, Nagoya (JP); Tsuneaki Ohashi, Ogaki (JP)

(73) Assignee: NGK Insulators, Ltd., Nagoya City (JP)

( * ) Notice: Subject to any disclaimer, the term of this patent is extended or adjusted under 35 U.S.C. 154(b) by 35 days.

(21) Appl. No.: 10/044,500

(22) Filed: Jan. 10, 2002

(65) Prior Publication Data

US 2002/0139473 A1    Oct. 3, 2002

(30) Foreign Application Priority Data

Jan. 30, 2001 (JP) .............................. 2001-022294

(51) Int. Cl.
*H02N 13/00* (2006.01)
(52) U.S. Cl. ..................................... 361/234
(58) Field of Classification Search ................ 361/234, 361/233; 279/128, 234
See application file for complete search history.

(56) References Cited

U.S. PATENT DOCUMENTS

| | | | | |
|---|---|---|---|---|
| 4,184,188 A | * | 1/1980 | Briglia | 361/234 |
| 5,745,331 A | * | 4/1998 | Shamouilian et al. | 361/234 |
| 5,798,904 A | * | 8/1998 | Guyot | 361/234 |
| 5,835,334 A | * | 11/1998 | McMillin et al. | 361/234 |
| 5,867,359 A | * | 2/1999 | Sherman | 361/264 |
| 5,870,271 A | * | 2/1999 | Herchen | 361/234 |
| 5,909,355 A | * | 6/1999 | Parkhe | 361/234 |
| 6,057,513 A | * | 5/2000 | Ushikoshi et al. | 174/260 |
| 6,071,630 A | * | 6/2000 | Tomaru et al. | 428/627 |
| 6,104,596 A | * | 8/2000 | Hausmann | 361/234 |
| 6,108,189 A | * | 8/2000 | Weldon et al. | 361/234 |
| 6,256,187 B1 | * | 7/2001 | Matsunaga et al. | 361/234 |

FOREIGN PATENT DOCUMENTS

| | | |
|---|---|---|
| JP | 3-3249 | 1/1991 |
| JP | 4-287344 | 10/1992 |

OTHER PUBLICATIONS

Dave S. Steinberg, Cooling Techniques for Electronic Equipment, 1991, John Willey & Sons, Inc., 2$^{nd}$ Edition, p. 39.*

* cited by examiner

*Primary Examiner*—Brian Sircus
*Assistant Examiner*—Zeev Kitov
(74) *Attorney, Agent, or Firm*—Burr & Brown

(57) ABSTRACT

An electrostatic chuck and a method for manufacturing the same are provided. The electrostatic chuck has a bonded structure comprising a ceramic electrostatic chuck member, a metal member and a bonding layer. The bonding layer has at least a first outermost bonding layer joined to the ceramic electrostatic chuck member, a second outermost bonding layer joined to the metal member, and an intermediate polyimide layer disposed between the first and second outermost bonding layers. Each of the outermost bonding layers are made of a silicone layer or an acrylic.

7 Claims, 2 Drawing Sheets

ELECTROSTATIC CHUCK HAVING BONDED STRUCTURE AND METHOD OF MANUFACTURING THE SAME

This application claims priority from Japanese Application 2001-022294, filed Jan. 30, 2001, the entirety of which is incorporated herein by reference.

BACKGROUND OF THE INVENTION AND RELATED ART STATEMENT

The present invention relates to an electrostatic chuck having a bonded structure formed by bonding a ceramic electrostatic chuck member and a metal member, and to a method of manufacturing thereof.

As shown in FIG. 2, an electrostatic chuck 25 having a bonded structure contains an electrostatic chuck member 10, a metal member 12 as a base material and a bonding layer 14. And, after a silicon wafer 16 is held (chucked) on the electrostatic chuck member 10 by electrostatic attraction, treatments such as CVD (chemical vapor deposition), sputtering, etching and the like are performed on a surface of the silicon wafer 16 within a system, for example, a CVD system, a sputtering system, an etcher and the like as it is. Further, an electrostatic chuck electrode 18 is embedded in the electrostatic chuck member 10 so that the electrostatic chuck member 10 is charged by applying a voltage from a terminal 20 thereto and the silicon wafer 16 is held with the chuck member by virtue of the resulting electrostatic attraction.

In the electrostatic chuck 25 having bonded structure comprising an electrostatic chuck member and a metal member as described above, when treatments such as CVD, sputtering, etching and the like are performed, which treatments use a plasma reaction, it becomes difficult to control film formation on the silicon wafer because temperature is increased in the silicon wafer due to heat input from the plasma. As a measure to solve the problem, there have been employed the mechanism for cooling the metal member 12, the method for cooling the electrostatic chuck member 10 and the metal member 12 by introducing Ar gas or $N_2$ gas 22 between the electrostatic chuck 10 and silicon wafer 16, or the like. In addition, when the treatments such as CVD, sputtering, etching and the like are performed, which treatments use a plasma reaction, the electrostatic chuck member 10, the metal member 12 and the bonding layer 14 are exposed to a chemically severe atmosphere.

In an electrostatic chuck, there have conventionally been known, as a method of fixing an electrostatic member to a metal member, a method of using a mechanical clamp structure with clamps and bolts, a method of using an organic adhesive or glass as a bonding layer, and the like. When a bonding layer is used, because the bonded structure for an electrostatic chuck is exposed to a chemically severe atmosphere as described above, the bonding layer is required to have good heat conductivity, airtightness, corrosion resistance, and further flatness of the electrostatic chuck member after being bonded, as well as high bonding strength.

In recent years, although ceramic electrostatic chuck members have been widely used, their low mechanical toughness makes it difficult to fix them by mechanical methods such as the use of the mechanical clamp structure and the like. In the case where a general organic adhesive was used, there was a problem that strain and cracks were caused in the surface of the ceramic electrostatic chuck member during use in a wide temperature range, and in the case where glass was used, there was a problem that deformation of a metal member was generated because a high temperature was required for bonding.

In order to solve these problems, JP-A-4-287344 has proposed a bonded structure using a silicone resin in a paste form as a bonding layer, and JP-A-3-3249 has proposed a bonded structure using indium as a bonding layer.

However, in the case where a ceramic electrostatic chuck member and a metal member are bonded using a silicone resin in a paste form or indium as a bonding layer, if bonding pressure is low, a defect will be caused in the bonding, resulting in some problems in reliability of bonding strength and airtightness. On the other hand, if bonding pressure is high, there was caused a problem of making the bonding material bleed out from the joint surface. Moreover, there was such a problem that the flatness of the electrostatic chuck member was deteriorated after bonding due to a difference in thermal expansion between the electrostatic chuck member and the metal member.

SUMMARY OF THE INVENTION

The present invention has been made to solve the above described problems and is aimed at providing an electrostatic chuck having a bonded structure, in which airtightness, bonding strength and corrosion resistance of a bonding layer are good, the problem of bleeding out the bonding material under high pressures at the time of bonding is solved, and further the electrostatic chuck having a bonded structure is good in heat conductivity, shows a small deformation due to temperature change, and is good in flatness of an adsorption (attraction) surface, so that it can be used in applications where high precision and high reliability are required, and providing a method of manufacturing the same.

According to the present invention, there is provided an electrostatic chuck having a bonded structure comprising a ceramic electrostatic chuck member, a metal member, and a bonding layer; the ceramic electrostatic chuck member and the metal member being bonded with the bonding layer, wherein the bonding layer has at least a first most outer bonding layer being bonded to the ceramic electrostatic chuck member, a second outermost bonding layer being bonded to the metal member, and a polyimide layer being disposed between the first and second outermost bonding layers, and each of the first and second outermost bonding layers is made of either a silicone layer or an acrylic layer.

Further, according to the present invention, there is provided a method of manufacturing an electrostatic chuck having a bonded structure comprising a ceramic electrostatic chuck member, a metal member, and a bonding layer; the ceramic electrostatic chuck member and the metal member being bonded with the bonding layer, wherein the bonding layer has at least a first outermost bonding layer being bonded to the ceramic electrostatic chuck member, a second outermost bonding layer being bonded to the metal member, and a polyimide layer being disposed between the first and second outermost bonding layers, and each of the first and second outermost bonding layers is made of either a silicone layer or an acrylic layer;

wherein the method comprises the steps of:

preparing a sheet comprising at least a first outermost layer, second outermost layer made of either a silicone layer or an acrylic layer, and an intermediate layer being disposed between the first and second outermost layers and made of a polyimide layer, vacuum-packing the electrostatic chuck member, the bonding layer, and the metal member, the sheet being sandwiched between the electrostatic chuck member and the metal member, into a vacuum-packing bag; and heating the thus vacuum-packed electrostatic chuck member, bonding layer and metal member under isotropic pressurization to bond them firmly.

BRIEF DESCRIPTION OF THE DRAWINGS

FIG. 3 (b) shows a vacuum packing step; and FIG. 3 (c) shows an isotropic pressurization step.

DETAILED DESCRIPTION OF PREFERRED EMBODIMENT

In the following, the present invention will be described based on the drawings according to the embodiments, but the present invention will not limited to these embodiments.

Figure 1:
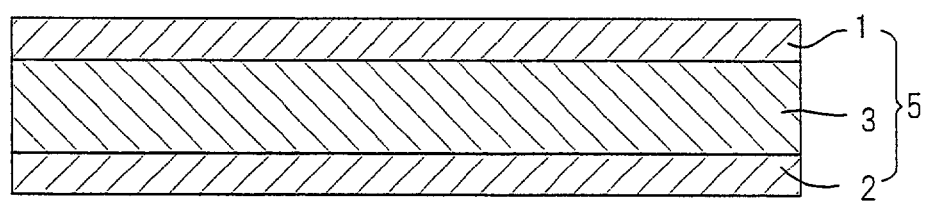
FIG. 1 is a sectional view showing one embodiment of a bonding layer to be used in the present invention.
Figure 2:
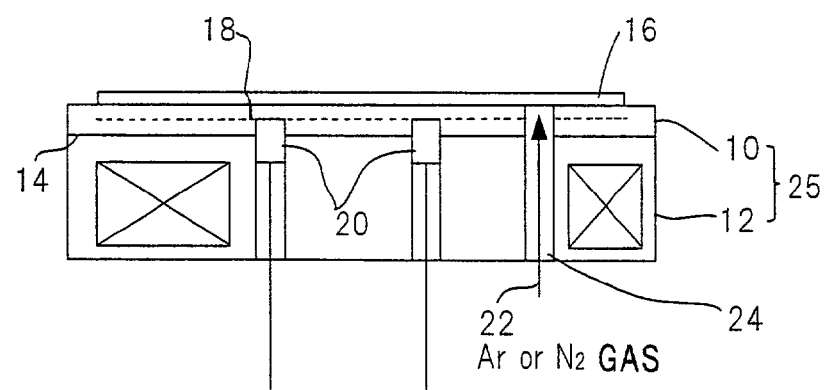
FIG. 2 is a view showing the state in which a silicon wafer is held with a bonded structure for an electrostatic chuck according to the present invention.

FIG. 1 shows an embodiment of a bonding layer that is a characteristic feature in an electrostatic chuck having a bonded structure according to the present invention. As shown in FIG. 1, a bonding layer 5 has at least a first outermost bonding layer 1 being joined to a ceramic electrostatic chuck member 10 (see FIG. 2), a second outermost bonding layer 2 being joined to a metal member 12 (see FIG. 2) and a polyimide layer 3 being disposed between the first and second outermost bonding layers 1 and 2, and each of first and second outermost bonding layers 1 and 2 is composed of a silicone layer or an acrylic layer.

In an electrostatic chuck having a bonded structure according to the present invention, because the bonding layer has a constitution as described above, the bonding layer shows good airtightness, good bonding strength and good corrosion resistance, and the bleeding out problem of the bonding material at the time of bonding can be practically eliminated. In addition, the bonded structure of the present electrostatic chuck is good in heat conductivity, and it shows a small deformation due to temperature change. Therefore, the present electrostatic chuck can show a good flatness of an adsorption surface. Accordingly, the present electrostatic chuck having a bonded structure can be used in applications where high precision and high reliability are required.

Each member comprising the bonding layer used in the present invention will be described. The first and second outermost bonding layers 1 and 2 are comprised of a silicone layer or an acrylic layer. Both of the first and second outermost bonding layers 1 and 2 may be the same acrylic layer or silicone layer, and any one of them may be an acrylic layer and the other may be a silicone layer.

The polyimide layer 3 being disposed between the first and second outermost bonding layers 1 and 2 is mainly composed of a polyimide. A polyimide is a high molecular substance having an acid amide bond in the main chain and preferably has 50 mol % or more of a constitutional repeating unit expressed by formula (1) in the whole constitution of the polyimide.

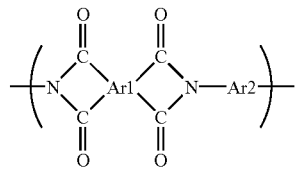

formula (1)

[where, Ar1 contains at least one aromatic ring, and two carboxylic groups forming an amide ring are bonded to adjacent carbon atoms on the aromatic ring; Ar2 is an organic group and is preferable to contain an aromatic ring.]

More preferably, a polyimide has 50 mol % or more of a constitutional repeating unit expressed by formula (2) in the whole constitution of polyimide.

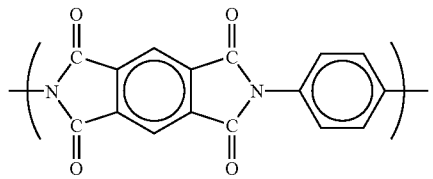

formula (2)

The acrylic layer contains an acrylic resin as the main component. The acrylic resin is a general term for polymers obtained by polymerizing acrylic acid and its derivatives and includes polymers and copolymers of acrylic acid and its esters, acrylamide, acrylonitrile, methacrylic acid and its esters, and others, and which polymers and copolymers may be crosslinked or non-crosslinked. The silicone layer contains a silicone resin as the main component. The silicone resin is a polymer of a silicide having a siloxane bond as the main skeletal structure. The silicone resin may be crosslinked or non-crosslinked, and has, for example, a constitutional repeating unit comprising of a component of formula (3) and/or formula (4) as the main component.

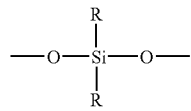

formula (3)

(where R is H, $CH_3$, $C_2H_5$, $C_6H_5$ and the like)

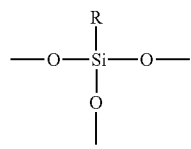

formula (4)

(where R is H, $CH_3$, $C_2H_5$, $C_6H_5$ and the like)

The thickness of the bonding layer 5 is preferable to be 0.05 to 0.5 mm. This is because the flatness in the adsorption surface of the electrostatic chuck member 10 after being jointed becomes worse if the thickness of the bonding layer 5 is thinner than 0.05 mm, and it becomes difficult to transfer smoothly the heat in the electrostatic chuck member 10 to the metal member 12 if the thickness is larger than 0.5 mm. The thickness of the bonding layer 5 is more preferable to be 0.08 to 3.0 mm and is the most preferable to be 1.0 to 2.5 mm. The flatness of the electrostatic chuck member 10 can be made to be within 30 μm by making the thickness of the bonding layer 5 be 0.05 to 0.5 mm. The present electrostatic chuck having a bonded structure mentioned above may be used in applications requiring high precision and high reliability by making the flatness of the electrostatic chuck be within 30 μm.

The method of measuring the flatness will be described in the following. An electrostatic chuck member was put upward on a surface plate and the height of the surface of the electrostatic chuck member was measured with a height gage. As the measured points, total 17 points including the starting point, that is, the center of the electrostatic chuck as the starting point and each 8 points in the direction X-to-Y were measured, and the difference between the maximum measured value and the minimum measured value was defined as the flatness.

Moreover, in the first and second outermost bonding layers 1 and 2, and in the polyimide layer 3, particulate or squamous fillers having good thermal conduction may be dispersed in order to improve their heat conduction. As materials of the fillers, ceramics like alumina, aluminum nitride and SiC, and metals like Al are good, and their size is preferably 0.5 μm to 50 μm, and the content of the fillers is preferably 50 vol. % or less.

The electrostatic chuck member 10 is comprised of a ceramic material, for example, aluminum nitride (AlN), alumina ($Al_2O_3$), calcium titanate ($CaTiO_3$), or barium titanate ($BaTiO_3$), and is preferably comprised of aluminum nitride (AlN).

An electrostatic chuck electrode 18 is embedded in the electrostatic chuck member 10. It is preferable to embed the electrode during sintering electrostatic chuck member to form the electrostatic chuck member with the electrostatic chuck electrode as an integrated body from the antiflaking point of view and the like during its applications. The surface of the electrostatic chuck member 10 is charged by applying a voltage to the electrostatic electrode 18 through the terminal 20, resulting in the generation of electrostatic attraction, with which attraction silicon wafer 16 can be adsorbed on the adsorption surface, the upper surface of the electrostatic chuck member 10.

The metal member 12 supporting the electrostatic chuck member 10 serves to remove the heat in the electrostatic chuck member 10 and is comprised of, for example, aluminum, brass and others. More, in the electrostatic chuck member 10 and metal member 12 of the electrostatic chuck having a bonded structure 25, one may make a hole for a cooling medium 24 to pass a cooling medium, for example, argon gas (Ar gas), nitrogen gas (N2 gas) and the like. Further, instead of this, or in addition to this, the metal member 12 may be provided with an other cooling mechanism, for example, a water cooling mechanism and the like.

Next, one example of the manufacturing method of an electrostatic chuck having a bonded structure according to the present invention will be described in accordance with FIG. 3 (a) to FIG. 3 (c).

Figure 3A:
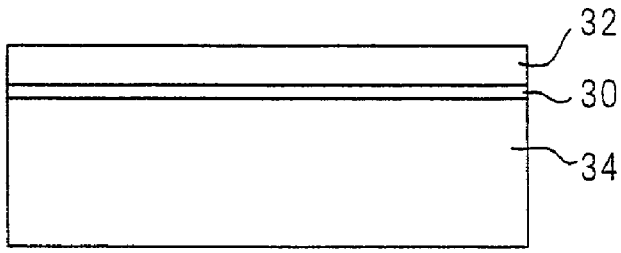
FIG. 3 (a), FIG. 3 (b), and FIG. 3 (c) show illustratively the steps of a method of manufacturing an electrostatic chuck having a bonded structure according to the present invention, FIG. 3 (a) shows a prebonding step.
Figure 3B:
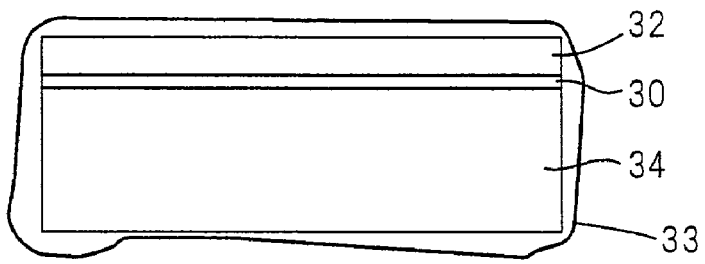
Figure 3C:
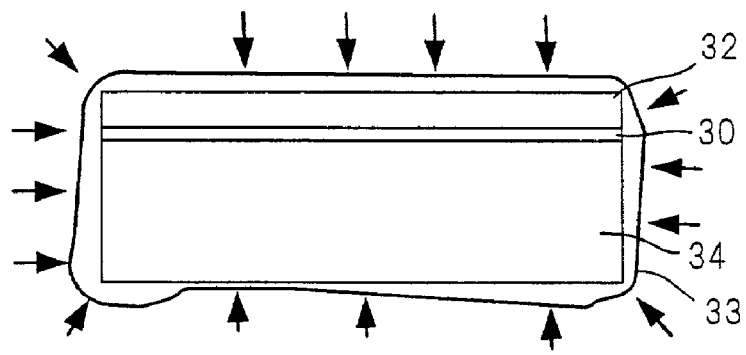

First of all, using a sheet having at least three layers, in which two outermost layers comprise a silicone layer or an acrylic layer and a polyimide layer disposed between them, as a bonding layer, an electrostatic chuck member 32 and a metal member 34 are prebonded to prepare a prebonded body as shown in FIG. 3 (a). Then, as shown in FIG. 3 (b), this prebonded body is vacuum packed into a bag. Vacuum packing can be carried out with a commercially available vacuum packer. With a vacuum packer, the prebonded body is put into, for example, a heat-resistant tubular film 33 both ends of which are open, and one of the openings is blocked up and air is let out from the other opening, then the other opening is blocked to make a vacuum packing of the prebonded body in a sealed state with a bag made of the heat-resistant tubular film 33. Next, as shown in FIG. 3 (c), the vacuum packed prebonded body is heated and cooled under isotropic pressurization in an isotropic pressure device, including an autoclave, and the electrostatic chuck member 32 and the metal member 34 are bonded to manufacture an electrostatic chuck having a bonded structure according to the present invention.

Figure 4:
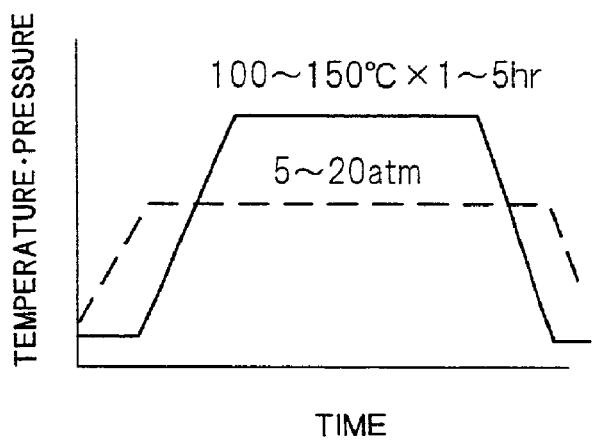
FIG. 4 is a graph showing the schedules of isotropic pressurization and heating.

An autoclave can be favorably used in the present invention because isotropic pressurization and heating can be performed at the same time. As conditions for isotropic pressurization and heating, for example, it is preferable to carry out the pressurization and heating in the schedules shown in FIG. 4. That is, it is preferable to maintain the autoclave at pressures of 5 to 20 atm and at temperatures of 100 to 150° C. for 1 to 5 hours.

EXAMPLE

In the following, the present invention will be described further in detail by examples, but the present invention should not be limited to these examples.

A sheet having at least three layers in which the two outermost layers were silicone layers and a polyimide layer was sandwiched between them, was used as a bonding layer 30 in Example 1, and a sheet having at least three layers, in which the two outermost layers were acrylic layers and a polyimide layer was sandwiched between them, was used as a bonding layer 30 in Example 2. After each of the sheets was put between an electrostatic chuck member and a metal member and vacuum packed, and the packed members were held in an autoclave at 120° C. under the pressure of 14 atm for 2 hours to be bonded.

On the other hand, using a silicone paste as an adhesive in Comparative example 1, after the paste had been applied to the surface of an electrostatic chuck member and the surface of a metal member in the thickness of 0.1 mm each through screen printing, the electrostatic member and the metal member were pasted together and held at 120° C. under atmospheric pressure for 2 hours to be bonded.

The flatness values of electrostatic members before and after bonding are shown in Table 1. All of the flatness values of electrostatic chuck members before bonding were 20 μm or less, but though the flatness values in Example 1 and Example 2 were hardly changed after bonding, the flatness value in Comparative Example 1 was increased to 100 μm or more. Further, the results of measuring the airtightness of the gas hole and bonded part using a He-leak detector showed good airtightness of 1E−9 Pa·m$^3$/s or less in both Example 1 and Example 2.

TABLE 1

| No. | Bonding layer | Flatness of electrostatic chuck members (Before bonding) | Flatness of electrostatic chuck members (After bonding) | Amount of leaked He (After bonding) |
|---|---|---|---|---|
| Example 1 | Three layer sheet, silicone/polyimide/silicone | 15.5 μm | 14.3 μm | 1.5E−10 Pa · m$^3$/s |
| Example 2 | Three layer sheet, acrylic/polyimide/acrylic | 18.3 μm | 16.0 μm | 1.7E−10 Pa · m$^3$/s |
| Comparative Example 1 | Silicone paste | 17.5 μm | 113 μm | Not measured |

As described above, if the bonded structure for the electrostatic chuck according to the present invention is employed, the boding layer shows a good airtightness, a good bonding strength and a good corrosion resistance. Furthermore, the bleeding out of a bonding material even under high pressures can be almost eliminated at the time of bonding them. In addition, the electrostatic chuck according to the present invention has a bonded structure being good in heat conductivity, and it shows only a small deformation, even temperature changes a great extent. Furthermore, the present electrostatic chuck is good in the flatness of its adsorption surface. Therefore, the present electrostatic chuck electrostatic chuck may be used in applications where high precision and high reliability are required. Moreover, when the present manufacturing method for an electrostatic chuck is used, it is possible to obtain a bonded structure practically free from the bleeding out problem of a bonding material under high pressures at the time of bonding the electrostatic chuck member and the metal member with the bonding layer. Accordingly, the bonding layer may provide a higher bonding strength and a good airtightness, with an excellent flatness of its electrostatic adsorption surface.

What is claimed is:

1. An electrostatic chuck having a bonded structure comprising a ceramic member having an electrode in direct contact with said ceramic member, a metal member, and a bonding layer; said ceramic member and the metal member being bonded with said boding layer;
    wherein said bonding layer comprises at least a first outermost bonding layer bonded to said ceramic member, a second outermost bonding layer bonded to said metal member, and a polyimide layer disposed between said first and second outermost bonding layers, and wherein each of said first and second outermost bonding layers comprises a silicone layer.

2. The electrostatic chuck according to claim 1, wherein the thickness of said bonding layer is in a range of 0.05 to 0.5 mm.

3. The electrostatic chuck according to claim 1, wherein said ceramic member comprises an aluminum nitride base material formed as an integrated body by sintering said base material with said electrode embedded therein.

4. The electrostatic chuck according to claim 1, wherein an adsorption surface of said ceramic member has a flatness of 30 μm or less.

5. The electrostatic chuck according to claim 1, wherein said electrode is embedded in said ceramic member.

6. An electrostatic chuck having a bonded structure comprising a ceramic electrostatic chuck member, a metal member, and a bonding layer bonding said ceramic electrostatic chuck member and said metal member, said bonding layer consisting of a first outermost silicone bonding layer bonded to said ceramic electrostatic chuck member, a second outermost silicone bonding layer bonded to said metal member, and a polyimide layer disposed between said first and second outermost silicone bonding layers.

7. The electrostatic chuck according to claim 6, further comprising an electrode embedded in said ceramic electrostatic chuck member.

* * * * *